US 8,840,799 B2

(12) United States Patent
Rowe et al.

(10) Patent No.: US 8,840,799 B2
(45) Date of Patent: Sep. 23, 2014

(54) BINARY THERMOELECTRIC MATERIAL CONTAINING NANOPARTICLES AND PROCESS FOR PRODUCING THE SAME

(75) Inventors: Michael P. Rowe, Pickney, MI (US); Li Qin Zhou, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 171 days.

(21) Appl. No.: 13/309,321

(22) Filed: Dec. 1, 2011

(65) Prior Publication Data

US 2013/0140505 A1    Jun. 6, 2013

(51) Int. Cl.
*H01L 35/16*    (2006.01)

(52) U.S. Cl.
USPC ............... 252/62.3 T; 136/238; 136/236.1; 264/7; 264/614; 427/215

(58) Field of Classification Search
USPC ....... 252/62.3 T; 136/238, 236.1; 264/7, 614; 427/215
See application file for complete search history.

(56) References Cited

U.S. PATENT DOCUMENTS

| | | | |
|---|---|---|---|
| 5,008,726 A | 4/1991 | Nakagawa et al. | |
| 6,300,862 B1 | 10/2001 | Ishida | |
| 6,444,894 B1 | 9/2002 | Sterzel | |
| 7,309,830 B2 | 12/2007 | Zhang et al. | |
| 2004/0217333 A1 | 11/2004 | Miyashita et al. | |
| 2006/0022191 A1 | 2/2006 | Bakkers et al. | |
| 2008/0087314 A1* | 4/2008 | Xiao et al. | 136/201 |
| 2008/0173344 A1 | 7/2008 | Zhang et al. | |
| 2009/0151766 A1* | 6/2009 | Murai et al. | 136/201 |
| 2009/0293928 A1 | 12/2009 | Liang et al. | |
| 2010/0025616 A1 | 2/2010 | Kanatzidis et al. | |
| 2010/0108115 A1* | 5/2010 | Lee et al. | 136/236.1 |
| 2010/0173438 A1* | 7/2010 | Murai | 438/54 |
| 2010/0215852 A1 | 8/2010 | Rowe et al. | |
| 2011/0017951 A1 | 1/2011 | Ryowa | |

OTHER PUBLICATIONS

U.S. Appl. No. 13/309,294, filed Dec. 1, 2011, Rowe, et al.
U.S. Appl. No. 13/309,272, filed Dec. 1, 2011, Rowe, et al.
U.S. Appl. No. 13/094,479, filed Apr. 26, 2011, Rowe, et al.
U.S. Appl. No. 13/842,480, filed Mar. 15, 2013, Rowe, et al.

* cited by examiner

*Primary Examiner* — Carol M Koslow
(74) *Attorney, Agent, or Firm* — Oblon, Spivak, McClelland, Maier & Neustadt, L.L.P.

(57) ABSTRACT

A thermoelectric material that comprises a binary main group matrix material and nano-particles and/or nano-inclusions of metal oxide dispersed therein, and has electrical properties of ternary doped materials. A process for making the thermoelectric material that includes reacting a reduced metal precursor with an oxidized metal precursor in the presence of nanoparticles.

20 Claims, 11 Drawing Sheets

BINARY THERMOELECTRIC MATERIAL CONTAINING NANOPARTICLES AND PROCESS FOR PRODUCING THE SAME

FIELD OF THE INVENTION

The invention relates to a thermoelectric material that comprises a binary main group matrix material and nanoparticles and/or nanoinclusions, and a process for making the thermoelectric material.

BACKGROUND OF THE INVENTION

Thermoelectric materials and devices may be utilized to obtain electrical energy from a thermal gradient. Current thermoelectric materials have a limited thermoelectric conversion efficiency which may be defined in terms of the formula $$ZT = S^2 \gamma / \kappa \times T.$$

The ZT of the above formula or figure of merit is related to the macroscopic transport parameters of the material including the Seebeck coefficient S, the electrical conductivity $\gamma$ and the thermal conductivity $\kappa$.

In order to improve the thermoelectric conversion efficiency one may increase the Seebeck coefficient and electrical conductivity while lowering the thermal conductivity. Increasing the ZT is difficult as the three parameters S, $\gamma$ and $\kappa$ are interrelated. For example, doping of a specific material may increase the electrical conductivity while decreasing the Seebeck coefficient and increasing the thermal conductivity. There is therefore a need in the art for a material having a ZT improved over conventional materials. There is also a need in the art for increasing the thermoelectric conversion by increasing or maintaining the Seebeck coefficient and electrical conductivity while lowering a thermal conductivity.

Nanostructured materials may be utilized to produce thermoelectric nanoparticles and materials for a thermoelectric composite materials. However, such nanostructured materials may be difficult and expensive to manufacture and may be difficult to process to form a composite material. Conventional thermoelectric nanostructured materials and processes for producing the same are unable to provide enhanced thermoelectric conversion efficiency. Additionally, conventional processes for producing thermoelectric nanoparticles are not cost efficient, or scalable, and do not produce thermoelectric composites having improved properties that overcome the technical problems associated with conventional thermoelectric nanoparticles and thermoelectric composite materials.

The semiconductor materials that are used to make thermoelectric materials are often classified as N-type or P-type. An N-type semiconductor material has an excess of negative electron charge carriers and thereby provides greater electron conduction than the native semiconductor material. In contrast a P-type semiconductor has an excess of positive charge carriers (e.g., holes).

Conventionally the native semiconductor material is doped with a dopant or mixed with a further element to obtain N-type or P-type behavior. Elements and dopants for semiconductor materials such as bismuth telluride include selenium (N-type) and antimony (P-type). Bismuth selenium telluride is an example of a ternary material that exhibits N-type behavior due to the inclusion of atoms of selenium in the bismuth tellurium matrix structure.

SUMMARY OF THE INVENTION

In one aspect the invention includes a thermoelectric material comprising a binary matrix material and nanoparticles and/or nano-particle inclusions. Representative examples of the nanoparticles include particles of materials having formula MO and/or M wherein M is a Group 2 or 12 element in a 2+ oxidation state.

The matrix material is a binary main group or chalcogenide semiconductor material preferably including elements Bi and Te, preferably of formula $Bi_xTe_z$ where x is from 0.1 to 3 and z is from 0.1 to 4 where x and z represent the molar ratio based on the total moles of Bi and Te and more preferably of formula $Bi_2Te_3$. In other examples, the semiconductor matrix material may be an alloy of bismuth telluride and a further element (e.g., an element providing enhanced electroconductivity), or other material having an appreciable thermoelectric effect in bulk. Examples of the present invention include thermoelectric materials with high figures of merit, which can be used in thermoelectric devices having high conversion efficiency.

One aspect of the invention is a binary matrix material exhibits behavior of N-type ternary semiconductor materials even in the absence of a ternary metal. N-type characteristics such as high carrier mobility and/or high carrier concentration is achieved in combination with desirable effects related to electrical conductivity and Seebeck coefficient.

Another aspect of the invention includes a process for making a thermoelectric material containing a binary main group or chalcogenide matrix. The process includes mixing a metal precursor with one or more other metal precursors in the presence of nanoparticles. The mixture of metal precursors may include one or more reduced metals and one or more oxidized metals. Mixing the reduced and oxidized metals forms a binary mixture of main group metals in which the nanoparticles are dispersed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
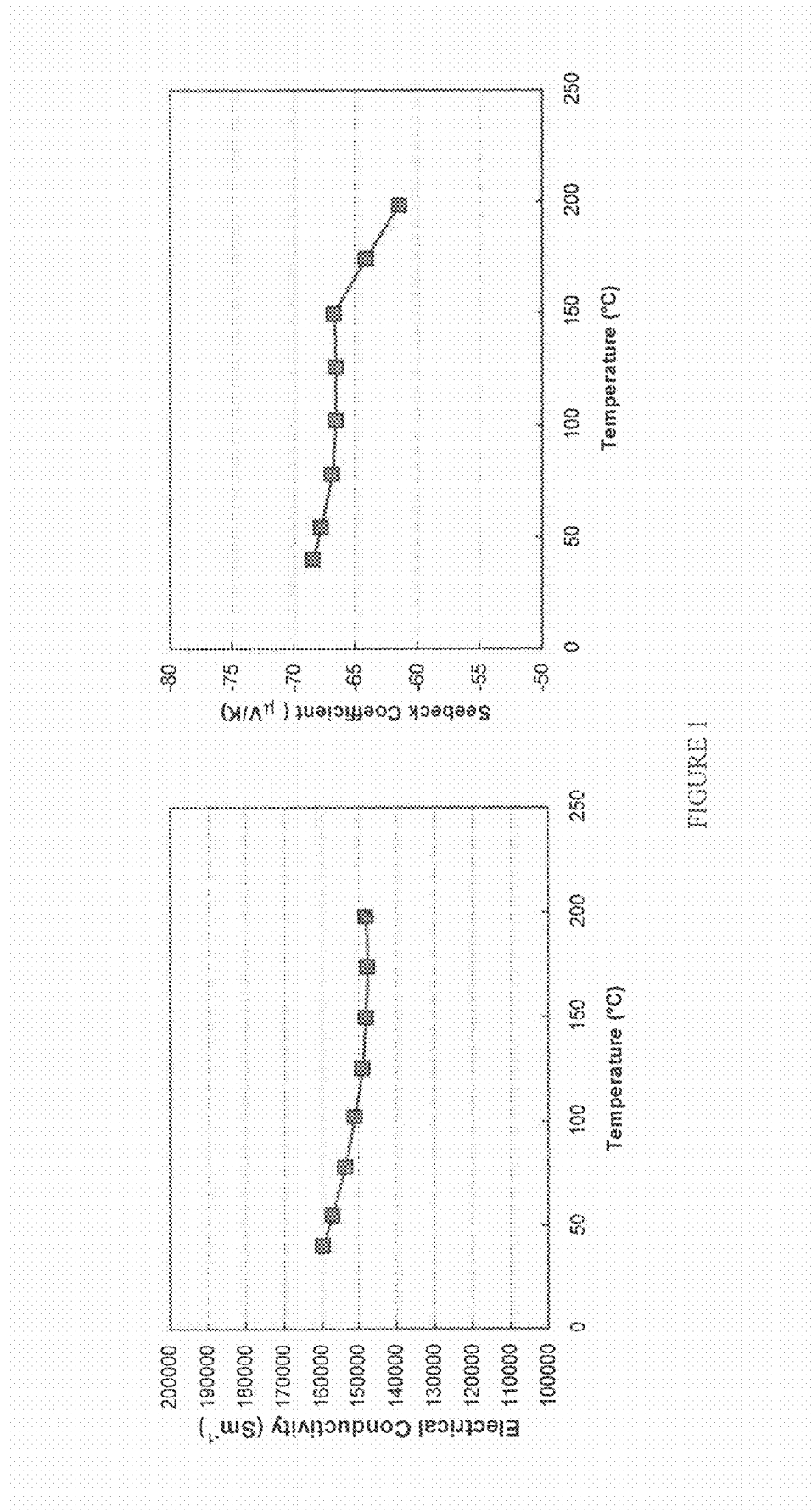
FIG. 1 describes the Seebeck coefficient and electrical conductivity of an embodiment of the invention in which the thermoelectric material is $Bi_2Te_3$ and the nanoparticles are ZnO.

Referring now to the drawings, wherein like reference numerals designate identical or corresponding parts throughout the several views.

The invention includes a thermoelectric material that comprises a binary main group matrix material and nanoparticles (e.g. ZnO) and/or nanoinclusions. Representative examples of the nano-particles include particles of materials having formula MO and/or M wherein M is a Group 2 or 12 element in a 2+ oxidation state or in metallic form.

The matrix material is a binary main group or chalcogenide semiconductor material preferably including elements Bi and Te and preferably of formula $Bi_2Te_3$. The semiconductor matrix material may be an alloy of bismuth telluride and a further optional element such as selenium (e.g., an element providing enhanced electroconductivity), or other material having an appreciable thermoelectric effect in bulk. Preferably the binary matrix material consists of bismuth and tellurium. The thermoelectric material includes materials having high figures of merit and which can be used in thermoelectric devices having high conversion efficiency.

The invention further includes a process for making the thermoelectric material. The process includes carrying out the reduction of one or more metal precursors with one or more other metal precursors in the presence of nanoparticles. The process can be carried out in an aqueous medium with readily available, optionally water stable, metals, metal compounds and reactants.

The term "bulk thermoelectric material" refers to a material that has appreciable thermoelectric behavior in a homogeneous bulk form. Such materials may be included in a thermoelectric material. Unless otherwise indicated, the term "thermoelectric material" is used to refer to a thermoelectric material according to an embodiment of the present invention. Such thermoelectric materials are exemplary, and should not be used to restrict the scope of the invention, which is defined by the claims.

The term "ceramic" is used to refer to inorganic, non-metallic materials, typically electrical insulators or semi-conductors, including compounds formed between metallic and nonmetallic elements such as aluminum and oxygen (e.g. alumina, $Al_2O_3$), calcium and oxygen (e.g. calcium oxide, CaO). Ceramics also include compounds formed between silicon and nitrogen (e.g. silicon nitride, $Si_3N_4$), silicon and oxygen (silica, $SiO_2$), and silicon and carbon (e.g. silicon carbide), and the like. As used herein, the term ceramic can also refer to glasses. The term ceramic is not limited to materials formed by a firing process. Ceramics can be used in various illustrative examples described herein, such as silica (silicon oxide) based matrix materials. However, it should be understood that other electrically insulating or low thermal conductivity materials can be used, such other oxides, nitrides, oxynitrides, carbides, silicides, borides, and the like.

The term "nanoparticle" is used to identify the particles having a particle size of 1-200 nm.

"Nano-inclusions" are nanoparticles dispersed throughout a matrix material. In this invention, nanoinclusions refers to ceramic nanoparticles dispersed throughout a thermoelectric matrix.

A "dopant" is a material added to or mixed with a semiconductor material for the purpose of modulating the electrical properties of the semiconductor material. Dopants include n-type dopants which add negative charges to the semiconductor structure and p-type dopants which add positive charge to the semiconductor structure. Dopants include metals such as Sb and metal complexes or meta precursors such as antimony salts and organometallic antimony salts.

The term "semiconductor" as used here includes doped semiconductors. A binary semiconductor is a material having a bulk structure that comprises at least two main metals and which exhibits semiconductor properties.

The binary semiconductor matrix material of the thermoelectric material of the invention may be chosen based on the desired operating temperature range required. Semiconductor matrix materials include bismuth telluride and its alloys, bismuth-tellurium compounds (which may be referred to as bismuth-tellurium alloys or bismuth telluride), and other binary tellurides. The semiconductor matrix material may include, optionally, any semiconducting antimonide or telluride in a minor amount, e.g., in an amount of less than 50% by weight based on the total weight of the semiconductor matrix material. Preferably the binary telluride does not include any other main group of chalcogenide dopant. Preferably, the binary main group semiconductor material comprises $Bi_2Te_3$ in an amount of at least 50% by weight based on the total weight of the binary main group semiconductor material. More preferably, the binary main group semiconductor material comprises $Bi_2Te_3$ in an amount of at least 50% by weight based on the total weight of the semiconductor material, and at least 50% by weight of the nanoparticles are particles of ZnO based on the total weight of the nanoparticles.

In one embodiment of the invention the thermoelectric material includes a binary semiconductor matrix material that is not doped with another metal but nonetheless shows electrical and physical properties characteristic of doped binary materials.

A thermoelectric material comprising a binary matrix material and nanoparticles can provide an improved thermoelectric figure of merit, compared with the figure of merit of a bulk sample of the binary semiconductor matrix material and/or a comparative ternary semiconductor material having a dopant such as Se or Sb. The enhancement may be due to the combination of low thermal conductivity, high electrical conductivity, and high Seebeck coefficient.

A figure of merit, Z, for a thermoelectric material may be defined as $Z=S^2\sigma/\gamma$, in terms of Seebeck coefficient (S), electrical conductivity ($\sigma$), and thermal conductivity ($\kappa$). An alternative dimensionless figure-of-merit is ZT, as Z varies with temperature. For a typical homogeneous bulk thermoelectric material, such as alloys of bismuth telluride, ZT is 1 or less. The figure of merit may be improved by increasing S and/or $\sigma$, and/or lowering $\kappa$. However, for a homogeneous bulk material, thermal conductivity and electrical conductivity are often correlated, so that increasing electrical conductivity also increases thermal conductivity, and the effects of both increases tend to cancel out in the figure of merit.

Quantum confinement effects due to the restricted dimensions of certain core-shell particles can further increase the figure of merit of the inventive thermoelectric material. The thermoelectric materials according to the present invention may therefore further include core-shell particles. Such core-shell particles are described, for example, in U.S. 2008/00087314 which is incorporated herein by reference in its entirety.

A thermoelectric material according to the present invention may have a high electrical conductivity ($\sigma$) due to interconnecting semiconductor network (or other electrical conductor, such as metal), such as shells of core-shell particles. Optionally, the thermoelectric material may have an enhanced value of Seebeck coefficient (S) due to the enhancement of the density of states near the Fermi level arising from quantum confinement effects. The thermoelectric material may at the same time have a low value of thermal conductivity κ compared to a bulk homogeneous sample of the matrix material, e.g., because of the lower thermal conductivity of the core material compared with the matrix material. The thermal conductivity may be further reduced due to increased phonon scattering by the nanoparticles and/or nano-inclusions, and possibly boundaries such as phase or crystalline transitions existing within the material. Hence, a nanocomposite thermoelectric material including nano-inclusions or other inclusions may have higher figure of merit, ZT, than a bulk sample of the material.

In one aspect of the invention, a binary semiconductor matrix material contains dispersed nanoparticles. The nanoparticle-containing material has carrier mobility, Seebeck and conductivity properties similar to or the same as the corresponding ternary n-doped semiconductor material. This aspect of the invention provides improvements over ternary semiconductors with regard to ease of manufacture and control of electrical properties.

The nanoparticles (e.g., zinc oxide) and/or nanoparticle inclusions in the binary semiconductor matrix material may to scatter phonons, and thereby lower the thermal conductivity of the material when used as a thermoelectric material. Unlike other systems, the binary matrix (e.g., bismuth telluride) does not include conventional dopants but instead derives advantageous electrical properties from the presence of the nanoparticles.

Conventional thermoelectric materials typically have a dimensionless figure of merit ZT less than 1 in bulk, and any such material may be used as a material in an example of the present invention.

FIG. 1 describes the Seebeck coefficient and electrical conductivity of an embodiment of the invention in which the binary semiconductor material is $Bi_2Te_3$ and the nanoparticles are ZnO. The thermoelectric material described in FIG. 1 was subjected to sintering at 400° C. and 100 MPa for 4 hours. FIG. 1 demonstrates the desirable drop and/or leveling off in Seebeck coefficient at temperatures above 150° C. Concurrently the electrical conductivity decreases with rising temperature in a manner that trends downward after 150° C. The thermoelectric material of the invention thus provides a material having an abrupt decrease in Seebeck coefficient at above 150° C. and a downward trending electrical conductivity at rising temperatures of different slope above 150° C.

Figure 2:
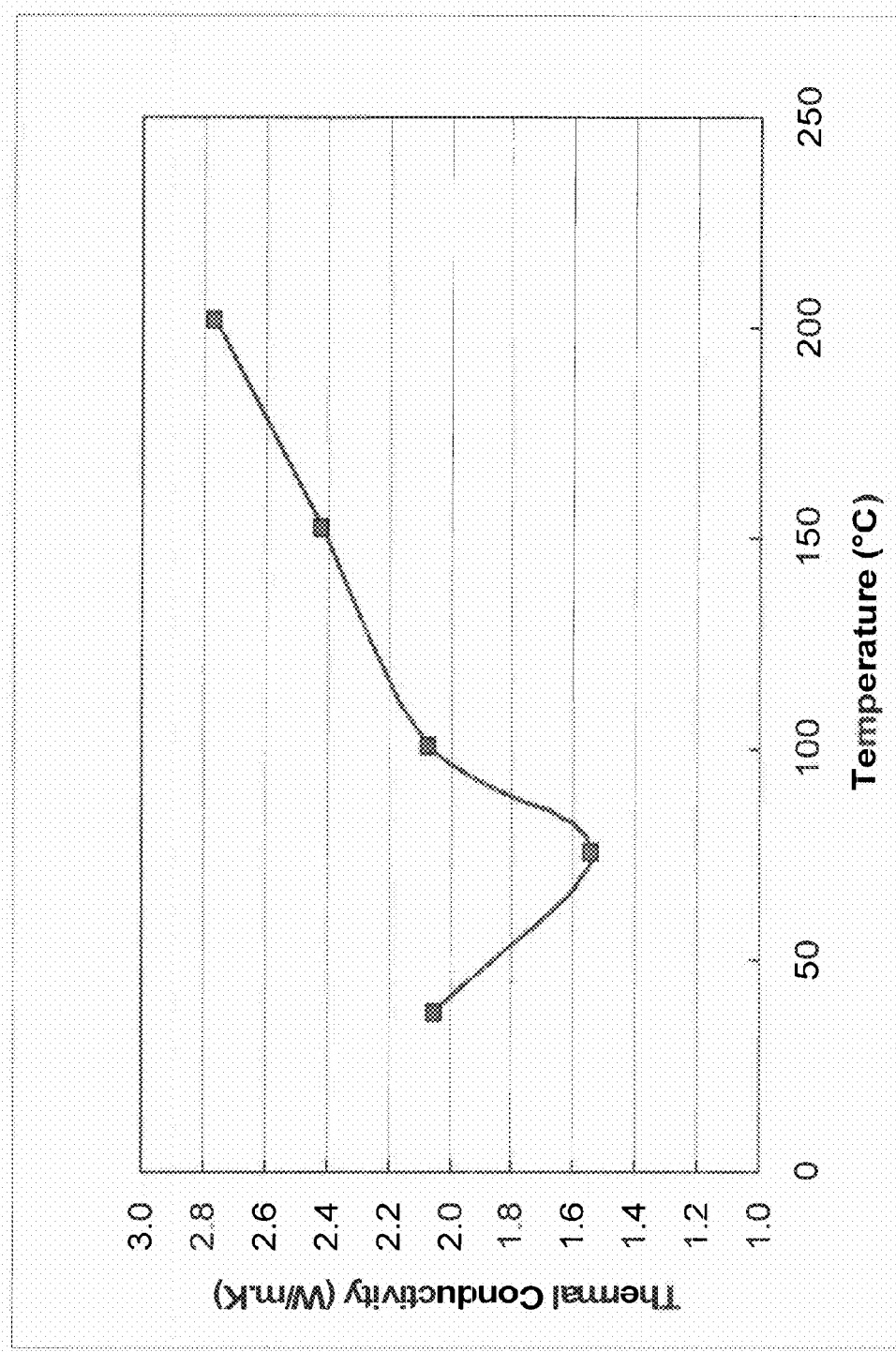
FIG. 2 describes the thermal conductivity of a thermoelectric material of an embodiment of the invention.

FIG. 2 describes the thermal conductivity of a thermoelectric material of the invention. The binary semiconductor material described in FIG. 2 is of formula $Bi_2Te_3$. The nanoparticles present in the thermoelectric material are ZnO. The thermoelectric material was made by sintering a precipitate at 400° C. and 100 MPa for 4 hours. The thermal conductivity of the thermoelectric material of the invention shown in FIG. 2 increases as temperature increases.

In one embodiment the thermoelectric material comprises a nanostructure network of the binary semiconductor matrix material arranged around the nanoparticles. For example, the binary semiconductor matrix may be an alloy of bismuth and tellurium, and/or other material having a dimensionless figure of merit $ZT \cong 1$ in bulk. The nanoparticle preferably has a low value of thermal conductivity, and can, for example, be an electrical insulator or poor electrical conductor. The nanoparticle need not be a thermoelectric material or a semiconductor material, in that a bulk sample of the second material need not show a useful (or even appreciable) thermoelectric effect in a bulk sample.

For example, the binary semiconductor matrix can be a nanostructured network. The nanostructured network may comprise nanowires, for example in an interconnected network including nanowires. The interconnected network can be three dimensional. Examples include a nanostructured bulk thermoelectric material comprising hexagonal or cubic semiconductor nanowire or nanomesh arrays within a ceramic matrix.

The nanostructure may also include particles, or other structures having a feature size (such as nanowire or nanoparticle diameter) in the nanometer (or nanoscale) range, for example, approximately 0.5-1000 nm, for example in the range 2-20 nm. All ranges are inclusive of given limits. The terms mesoscale, mesopore, mesoporous and the like, as used in this specification, refer to structures having feature sizes in the range 5 nm-100 nm. No particular spatial organization or method of manufacture is implied by the term mesoscale as used here. Hence, a mesoporous material includes pores, which may be ordered or randomly distributed, having a diameter in the range 5 nm-100 nm, whereas a nanoporous material includes pores having a diameter in the range 0.5-1000 nm.

The nanoparticle can alternately be a transition metal and/or a transition metal oxide having formula $M_aO_b$ and/or M wherein M is preferably a Group 4 element in a 4+ oxidation state (e.g., Ti(IV), Zr(IV) and/or Hf(IV)). In the formula $M_aO_b$ a and b may take values from 0 to 4, preferably a and b are such that the valences of the respective metal and oxygen are balanced and the material has 0 overall ionic charge. The nanoparticle is preferably of homogeneous character and/or optionally includes an outer layer of material of different compositions.

In preferred embodiments of the invention the nanoparticle has a unimodal particle size distribution. In other embodiments of the invention the nanoparticle has a multimodal particle distribution. The nanoparticle may thus include a first nanoparticle having a first average or mean particle size and a second nanoparticle of a second average or mean particle size. The particle sizes of the first and second particles may vary by 0.1-5, 0.5-2.5, 1-1.5 wherein the upper limit of the range represents the multiple by which the particle size diameter of the lower particle must be multiplied in order to obtain the particle size of the larger particle. The lower limit of the aforementioned ranges represents a multiplier by which the particle size of the larger diameter particle is multiplied to obtain the particle size of the smaller sized particle.

The nanoparticles dispersed in the semiconductor matrix material may be of different geometry, e.g., shape. In one embodiment the nanoparticles are essentially spherical having a degree of spherecity measured according to the Wadell formula ($\psi = (\sigma^{1/3}(6V_p)^{2/3})/A_p$) where $V_p$ is the volume of the nanoparticle and $A_p$ is the surface area of the particle. The sphericity of nanoparticles particles is preferably from 0.95 to 0.99 and may range, for example, from 0.90 to 0.99. The nanoparticles may also be of irregular shape such as ellipsoidal, tetrahedral, cubic or other polyhedral shape.

In one aspect of the invention Hall effect measurements show electrical and physical properties of the inventive binary semiconductor material are equivalent to ternary N-type doped semiconductor materials. The carrier mobility of embodiments of the inventive binary semiconductor material are preferably within ±50%, preferably ±40%, preferably ±30%, preferably ±20%, preferably ±10%, or preferably ±5% of the carrier mobility for corresponding ternary systems. For example the carrier mobility of $Bi_2Te_3$ including ZnO nanoparticles was measured to be −48.0. The corresponding ternary semiconductor material $Bi_2Se_{0.25}Te_{2.75}$ also has a carrier mobility of −48.0 measured under the same conditions. Alternately the inventive nanoparticle-containing binary semiconducting material has a carrier concentration that is preferably within ±50%, preferably ±40%, preferably ±30%, preferably ±20%, preferably ±10%, or preferably ±5% of the carrier concentration for corresponding ternary systems. For example the carrier concentration of $Bi_2Te_3$ including ZnO nanoparticles was measured to be $-2.12 \times 10^{20}$. $Bi_2Se_{0.25}Te_{2.75}$ also has a carrier concentration of $-2.12 \times 10^{20}$ measured under the same conditions.

In another embodiment of the invention the nanoparticle is surface treated by physical or chemical treatment. Physical treatment includes, for example, a smoothing or roughening treatment. Smoothing may be carried out by forming a slurry of the nanoparticles in a carrier fluid in the presence of a grinding particle such that the surface of the nanoparticles is smoothened by the treatment. Such treatment may likewise be used to generate a nanoparticle having a greater degree of sphericity. The surface treatment may include treating the nanoparticles with a high intensity discharge such as that formed by corona or by contact of the nanoparticle with a plasma.

The nanoparticles may be present in a major or minor amount relative to the total weight of the ternary material (e.g., based on the total amount by weight of materials of formula $Bi_xTe_z$). In one embodiment the total amount of nanoparticles is 50% by weight or less, preferably 40% by weight are less, preferably 30% by weight are less, preferably 20% by weight are less, preferably 10% by weight are less, or preferably 5% by weight are less. In an embodiment of the invention in which the nanoparticles are present in an major amount the nanoparticles are present in an amount of 50% by weight or more, preferably 60% by weight or more, preferably 70% by weight or more, preferably 80% by weight or more, preferably 90% by weight or more, preferably 100% by weight or more, preferably 150% by weight or more, or preferably 200% by weight or more. In other embodiments of the invention the weight ratio of the total weight of the binary semiconductor material and the nanoparticles is from 10:1 to 1:10, preferably from 9:1 to 1:9, preferably from 8:1 to 1:8, preferably from 7:1 to 1:7, preferably from 6:1 to 1:6, preferably from 5:1 to 1:5, preferably from 4:1 to 1:4, preferably from 3:1 to 1:3, preferably from 2:1 to 1:2, or 1:1.

In other embodiments of the invention the thermoelectric material and/or semiconductor matrix material can contain one or more fillers in addition to the nanoparticles. Examples of filler materials include conductivity enhancing and/or dampening materials such as stable solid materials, metal, ceramic, carbon, polymer, or combination thereof. Filler materials also include air or voids (for example, an air-filled semiconductor matrix, e.g., a hollow shell, or foam-like semiconductor matrix having a plurality of voids).

An example thermoelectric device according to an embodiment of the present invention includes a first electrical contact, a second electrical contact, and a thermoelectric material located within an electrical path between the first electrical contact and the second electrical contact. The thermoelectric material includes nanoparticles dispersed in a matrix material.

Figure 3:
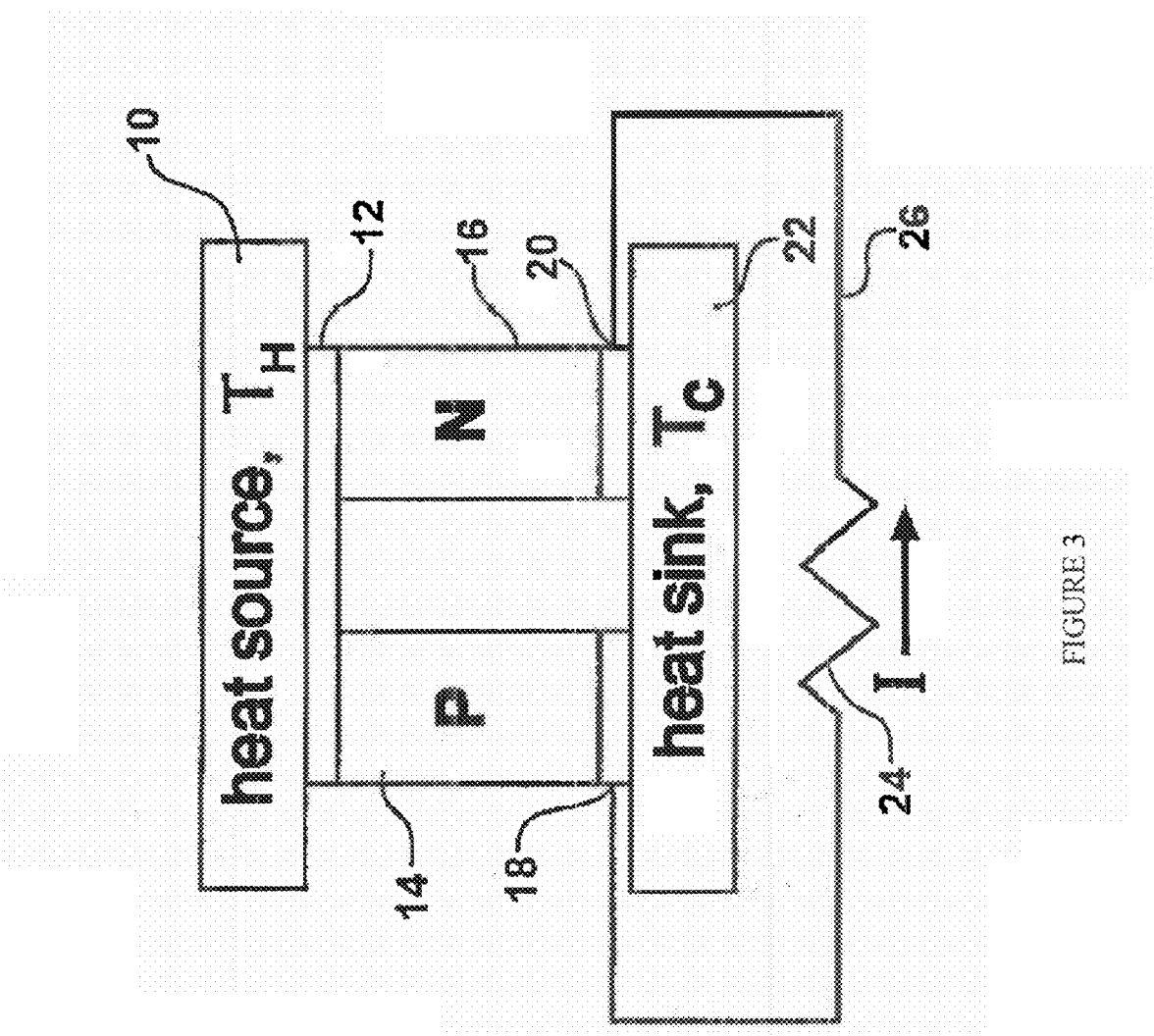
FIG. 3 shows a configuration of a thermoelectric device using an improved thermoelectric material according to an example of the present invention.

FIG. 3 illustrates a configuration of a thermoelectric device using an improved thermoelectric material according to an example of the present invention.

The device includes heat source 10, first electrically conducting layer 12, first thermoelectric material 14, second thermoelectric material 16, first electrical contact 18, second electrical contact 20, heat sink 22, and resistive load 24 connected to the thermoelectric device through electrical lead 26. When heat is provided by the heat source ($T_H > T_C$), current is generated in the direction shown in FIG. 3. Hence, this thermoelectric device is a Seebeck thermoelectric device, producing an electrical output from a heat input.

In this example, the first thermoelectric material includes an n-type semiconductor, and the second thermoelectric material includes a p-type semiconductor. The first thermoelectric material and/or the second thermoelectric material comprise a thermoelectric nanocomposite including nano-inclusions such as nanoparticles described herein. In an example where the first thermoelectric material includes nanoparticles, the semiconductor matrix material may comprise an n-type semiconductor, and in an example where the second thermoelectric material includes nanoparticles, the semiconductor matrix material may comprise a p-type semiconductor.

A similar configuration may be used to obtain Peltier heating or cooling, where an electrical potential is applied between the first and second electrical contacts so as to generate a thermal gradient in the device. For conciseness, this specification discusses the Seebeck effect (electricity obtained from thermal inputs), but in general the same considerations, such as figure of merit ZT, apply equally to Peltier device applications.

The improvement in figure of merit can influence the performance of the thermoelectrical device containing the thermoelectric material. A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave} = (T_H + T_C)/2$ is the average temperature, and Z is a figure of merit, defined as $Z = S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

Figure 4:
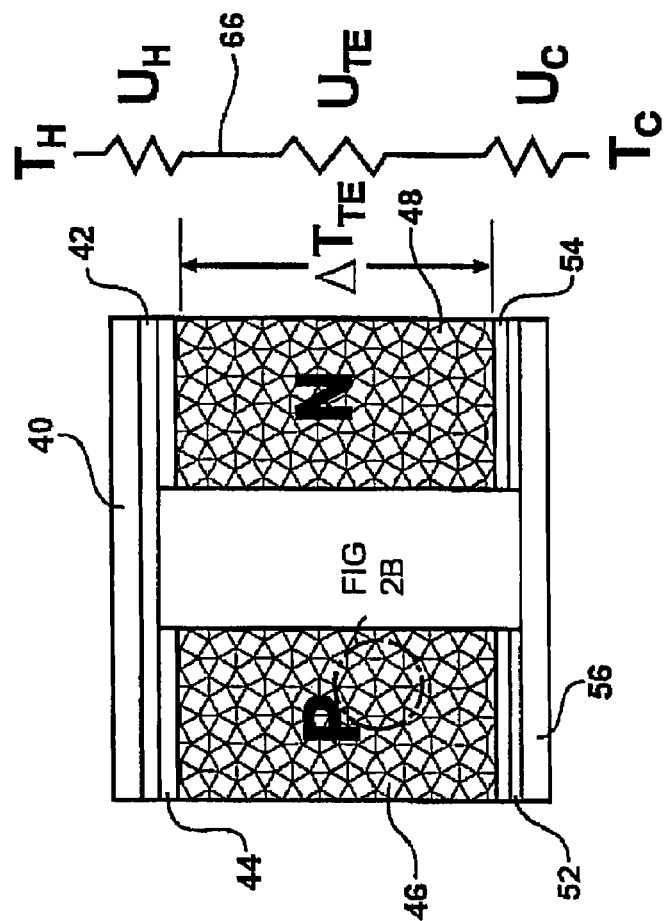
FIG. 4 shows a thermoelectric unicouple.

FIG. 4 shows a thermoelectric device, in this case a thermoelectric unicouple including a first ceramic layer 40, which can be placed in thermal communication with a heat source, metal layer 42, first and second thermoelectric materials 46 and 48, having nickel electrical pads such as 44, first and second electrical contacts 52 and 54 respectively, and second ceramic layer 56, which can be placed in thermal communication with a heat sink. The thermoelectric materials each includes a semiconductor matrix material in which a plurality of nanoparticles or nanoinclusions are present, which form a conducting network shown schematically in this figure.

FIG. 4 also shows a thermal circuit 66 corresponding to this unicouple which contains the thermal resistances for the transfer of heat from the hot reservoir $U_H$, to the cold reservoir $U_C$, and through the thermoelectric legs $U_{TE}$. $U_{TE} = L/\sigma A$ where L is the length of the legs, A is the cross-sectional area and a is the thermal conductivity. $U_H$ and $U_C$ contain the thermal resistance of the ceramic plate, as well as the coefficient of heat transfer from the hot side and to the cold reservoir.

The semiconductor matrix material of the thermoelectric material of the invention is essentially homogeneous with respect to composition. The nanoparticles are preferably uniformly dispersed in the semiconductor matrix material. The nanoparticles, when uniformly dispersed, form a thermoelectric material that is essentially homogeneous with respect to the appearance of nanoparticles and/or nanoinclusions therein. Uniform dispersion of the nanoparticles in the semiconductor matrix material can be confirmed by energy-dispersive X-ray spectroscopy (e.g., EDX, EDAX, EDS). Likewise, contrast resolution of Zn in the thermoelectric material confirms that there are no or a minimum number of agglomerations of nanoparticles in the thermoelectric material (see FIGS. 7-10).

In one embodiment of the invention the thermoelectric material is made by dispersing the nanoparticle in the semiconductor matrix material and/or by altering or inducing inclusions in the semiconductor matrix material. The nanoparticle is preferably dispersed within the semiconductor matrix material using a wet chemical method, e.g., using an aqueous and/or organic solution or suspension of materials.

In a preferable embodiment the synthesis of the thermoelectric material is carried out only in aqueous media and in the substantial absence of an organic solvent and/or an organic additive such as a surfactant and/or a dispersant.

In a preferable embodiment of the invention one or more reduced metal precursors, e.g., a metalide such as a telluride, is formed before the metal, e.g., tellurium, is mixed with any other components of the semiconductor matrix material. A telluride is a complex of Te metal in which a negative charge resides on the metal center, e.g., the metal atom is in a super-reduced state. Tellurides may be formed by reacting the metal, e.g., tellurium metal, with a reducing agent to form an intermediate material such as $NaTeBH_4$, NaTeH (i.e., sodium hydrogen telluride). In other embodiments tellurium precursors other than tellurium metal may be reacted with a reducing agent to form a metalide. Other tellurium precursors include oxides, halides, chalcogenides, hydroxides, and/or alkoxides of tellurium. In a preferable embodiment of the invention tellurium metal powder is reacted with a reducing agent under alkaline aqueous conditions to form a mixture that includes telluride. For example, tellurium metal is suspended in an alkaline medium such as water (adjusted to alkaline pH by mixing with a base such as NaOH). A reducing agent is then mixed with the tellurium metal and/or tellurium precursors, preferably, at least one of a halide, alkoxide, carboxylate or a mixture thereof.

Preferably the reducing agent is added to the tellurium metal and/or tellurium precursors to form a telluride. The reducing agent is preferably sodium borohydride. In other embodiments of the invention a telluride is formed by reducing a tellurium precursor with any reducing agent such as hydrazine, hydrogen gas, lithium-aluminum hydride, lithium borohydride, sodium hydride and the like. The reduction to form the metalide mixture is preferably carried out in an aqueous dispersion medium that is not susceptible to reduction or reaction with the reducing agent at ambient conditions.

It is especially preferred that the metalide, e.g., telluride, is mixed with an aqueous dispersion or solution of bismuth and/or compounds, each having an oxidation state of +1 or greater. In this embodiment of the invention the telluride acts to reduce the bismuth and/or other materials to form a tellurium-based, bismuth-containing semiconductor matrix material. The reduction may be carried out in the presence of "nanoparticles" to form a robust semiconductor matrix material having desirable thermal conductivity and thermoelectric properties.

In a particular embodiment of the invention a tellurium metal powder is suspended in an aqueous medium which preferably consists of a reaction mixture containing only the tellurium metal powder (or, optionally, other metal powders), water and an alkaline agent such as NaOH. A reducing agent such as sodium borohydride is mixed with the reaction mixture under an inert gas atmosphere. The resulting suspension is allowed to mix at ambient temperature. Preferably the tellurium metal suspension is cooled prior to mixing with the reducing agent. Mixing the reducing agent to tellurium metal powder mixture may result in an exothermic reaction which forms a precipitate and evolves hydrogen gas.

In a most preferred embodiment of the invention the thermoelectric matrix material is formed by reduction of one or more higher oxidation state precursors to form one or more of the elements of the binary semiconductor matrix material. Even more preferably the reduction is carried out such that each component of the semiconductor matrix material is present during the reducing. Most preferably each component of the semiconductor matrix material is present during the reducing and, in addition, the nanoparticle is present. In this embodiment of the invention the reduction of the metal complexes having an oxidation state of +1 or greater is conducted in a single step, e.g., by mixing the metalide with all of the metal complexes in a single reactor.

Separately from the formation of the metalide, a precursor mixture comprising one, two or a plurality of the precursors of the other components of the binary semiconductor material (e.g., the complexes of metals having an oxidation state of +1 or greater) are combined to form a suspension or solution in an alkaline aqueous medium to thereby form a second and, optionally third etc., precursor mixture(s). The precursor mixture preferably contains precursors of all of the other materials of the binary semiconductor matrix and is desirably degassed and maintained under an inert gas atmosphere. Preferable precursors include alkoxide and carboxylate compounds such as bismuth citrate and, optionally, potassium antimony tartrate. The precursors may be used in molar ratios corresponding to the desired composition of the semiconductor matrix material. Preferably the precursor mixture includes the nanoparticles, more preferably the entire amount of the nanoparticles of the thermoelectric material are present in the precursor mixture.

Mixing the precursor mixture with the reduced metal mixture (metalide, e.g., telluride) results in reduction of the precursors, e.g., reduction of metal complexes such as the bismuth citrate precursor compounds. The reduction is caused by reaction of the telluride and, optionally, residual amounts of reducing agent present in the reduced metalide mixture, with the bismuth precursors. Side products include salts and soluble organic compounds such as citric acid and, optionally, tartaric acid. The reaction of the reduced metal mixture with the precursor mixture(s) is carried out in the presence of the nanoparticles. The resulting reaction mixture is allowed to react at ambient temperature and/or elevated temperature up to about 50° C.

Prior to mixing the precursor mixture with the reduced metal precursor, the reduced metal precursor is desirably filtered, decanted and/or washed to separate any precipitate and/or unreacted tellurium metal.

The semiconductor matrix material formed by the reduction reaction of the first and second precursor mixtures precipitates as a solid material upon reduction of the precursors with the reduced metal. Side products such as citric acid, tartaric acid and salts can be removed from the reaction mixture by decanting and washing the resultant precipitate with water or an alkaline washing agent such as an aqueous composition containing a polar organic material and a base such as ammonium hydroxide. The semiconductor matrix material is optionally further separated from supernatant liquid by settling and/or centrifugation. To further purify the washed, collected and optionally dried precipitate, a step of extraction with, for example, an aqueous alcohol and/or aqueous alkaline solution is carried out. Preferably the extraction and washing are carried out at least partially with a Soxhlet extraction device under an inert atmosphere.

In a preferred embodiment of the invention no suspending or dispersing agents are present in the first reduced metals, the precursor mixture and/or any reaction mixture derived therefrom.

The washed, extracted semiconductor material is subsequently dried, e.g., under a flow of dry nitrogen or inert gas, and further preferably under action of sonification. An optional step of sieving the resultant free flowing powder may be carried out to obtain a desirable particle size. Preferably sieving is carried out to obtain a free flowing powder passing through a 50 micron, preferably 35 micron sieve.

The resultant sieved material is sintered at a temperature of up to 500° C., preferably up to 450° C., 400° C., 350° C. or 300° C., in the absence of oxygen. The sintering may cause chemical and/or physical changes to the semiconductor matrix material whereby the structure is annealed and/or crystal structure orientation or reorientation occurs. Prior to sintering the powder may be pressed into a desired form.

The resultant sintered material has the appearance of a metallic object and is air stable although subject to surface oxidation. A shiny, brittle metallic-like material is obtained having an electrical conductivity of between 1,000 and 200,000 μm.

Figure 5A:
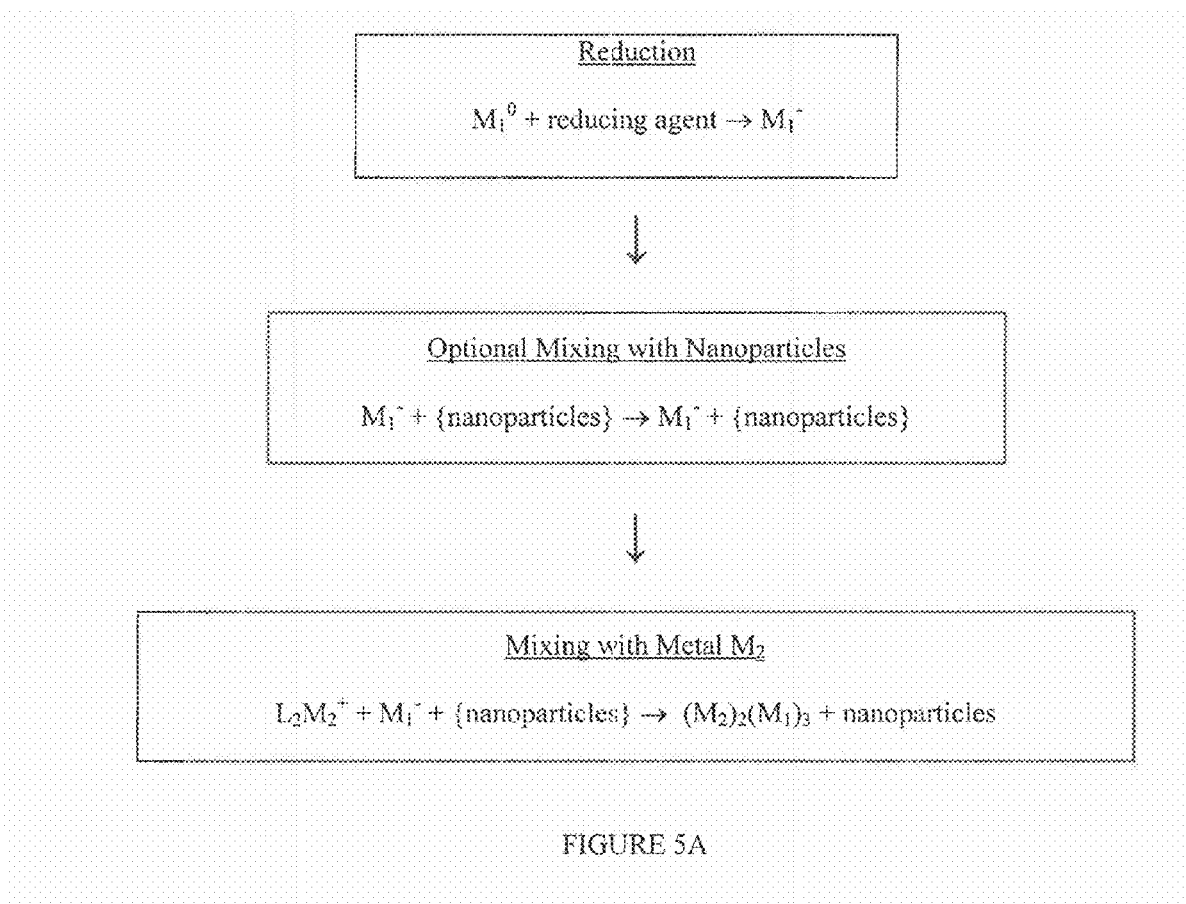
FIGS. 5A and 5B show flow diagrams of the synthetic steps involved in forming the thermoelectric material in embodiments of the invention.
Figure 5B:
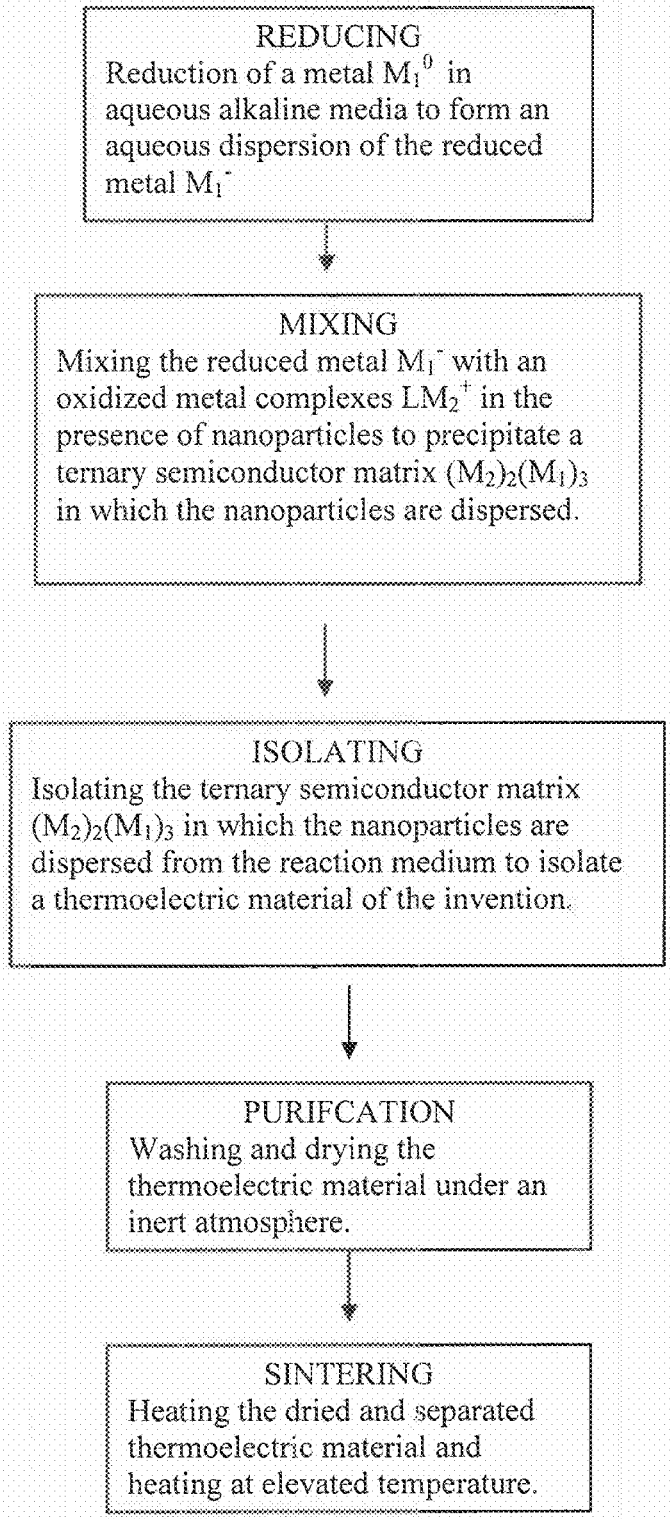

FIGS. 5A and 5B provide high level flow diagrams of processes for making thermoelectric materials of the invention. The process of the invention is illustrated by reference to FIG. 5A which shows a flow diagram of the synthetic steps involved in forming the thermoelectric material in one embodiment of the invention. In FIG. 5A elemental metal that is neither reduced nor oxidized is identified as $M_#^o$. Metals that are reduced and oxidized are depicted as $M_#^-$ and $M_#^+$, respectively. Reduced and oxidized metals may have an oxidation state that is −1, −2, −3, −4, and +1, +2, +3, +4, respectively.

The flowchart of FIGS. 5A and 5B demonstrate the synthesis of a thermoelectric material based on a binary chalcogenide semiconductor matrix material containing nanoparticles. The binary semiconductor matrix material is described as comprising at least two elements, i.e., $M_1$ and $M_2$. In a preferred embodiment of the invention each of the metals are main group metals of groups 13, 14, 15 and/or 16 of the Periodic Table. In a particularly preferred embodiment of the invention the metals are tellurium and bismuth, respectively. In other embodiments of the invention the steps used to make the thermoelectric material of the invention may include additional metals such as alkaline earth metals and transition metals together with metals $M_1$ and $M_2$ in any of the steps represented in the flow diagram in FIGS. 5A and 5B.

In one embodiment a first metal $M_1$ is reduced to form a reduced metal composition. In one embodiment of the invention the metal $M_1$ is suspended in a water-based dispersion medium. The water-based dispersion medium is preferably an alkaline aqueous matrix that includes only water and an alkaline agent such as NaOH and excludes organic solvents, surfactants and/or dispersants. The metal $M_1^o$ may include small amounts of a corresponding oxidized counterpart. For example, the metal $M_1$ can be used in the form of metallic powder, i.e., particles of metal, which may have a layer of surface oxidation. Such a metallic powder is nonetheless described as $M_#^o$ because it is comprised mainly of the metal in its elemental and unoxidized and/or unreduced form, e.g., a majority of the metal atoms are in the native metallic state having an oxidation state of zero. Preferably at least 80 mol %, 90 mol %, or 95 mol % of the metal $M_4$ is in its metallic unoxidized and/or unreduced state when it is suspended in a water-based alkaline dispersion medium. Dispersion of the metal $M_1^o$ in the alkaline dispersion medium preferably does not lead to any reaction between the $M_1^o$ and $M_2^o$ and/or between either metal and water or any alkaline agent. Preferably the dispersing is carried out under an inert atmosphere such that oxygen is not present during reducing and/or dispersing.

In a subsequent step a reducing agent is mixed with the $M_1^o$ aqueous dispersion. The reducing agent is mixed with an amount sufficient to reduce all of the $M_1$ metal to an overall negative charge, i.e., $M_1^-$. In the context of the present invention a reduced metal $M_#^-$ is a metal that may be present in the form of a complex such as $HM_#X$ where X is a counter ion such as a $Na^+$ and the like. The product formed by mixing the metal powder with a reducing agent is the reduced metal powder identified as $M_1^-$ in FIGS. 5A and 5B. The thus-formed reduced metal composition is preferably isolated from any precipitate by decantation of supernatant liquid to separate the reduced metal $M_1^-$ from any precipitate formed during the reducing step. As mentioned above the reducing of the $M_#^o$ metal(s) is preferably carried out in an alkaline dispersing medium.

The reduced metal is optionally mixed with nanoparticles. The nanoparticles may be added to or mixed with the reduced metal $M_#^-$ after the metal is in a completely reduced form and has been filtered from any precipitate. Alternately, the nanoparticles may be present in the dispersion of $M_#^o$ prior to the addition of the reducing agent or added concurrently with the reducing agent to the dispersion of the $M_#^o$ metal. Preferably the nanoparticles are mixed with the reduced metal only under conditions under which the reduced metal and the reducing agent will not reduce the nanoparticles. The nanoparticles may be any of the nanoparticle materials discussed herein. In one embodiment of the invention the nanoparticles are added to the $M_#^-$ dispersion in the form of an aqueous dispersion that is alkaline or slightly alkaline.

In a further step of the process for making the thermoelectric material, the dispersion containing the reduced metal $M_#^-$ and, optionally the nanoparticles, is mixed with a dispersion of one or more of the other metals or compounds comprising the metals forming the binary semiconductor matrix material and preferably containing the nanoparticles. The reduced $M_#^-$ dispersion may be added independently to the metal $M_2$. In a preferred embodiment the reduced metal containing $M_1^-$ is added to a mixture that contains an aqueous dispersion of metal $M_2$ where the $M_2$ metal is present as one or more compounds having an oxidation state of +1 or greater. In a preferable embodiment of the invention, described in FIGS. 5A and 5B, the metal $M_2$ is in an oxidized form, i.e., $M_2^+$. The reduced metal dispersion $M_#^-$ may be added preferably to a single aqueous dispersion containing $M_2$. Preferably all of the metal of metals $M_2$ are present in an oxidized state. In an oxidized state identified as $M_#^+$ the core metal may be in an oxidation state of +1, +2, +3, or +4, or a mixture of said oxidation states. The reduced metal mixture $M_#^-$ is added to the aqueous dispersion of $M_2$ in a molar amount corresponding to the stoichiometry of the desired binary semiconductor matrix material. For example, if the desired semiconductor matrix material is of formula $(M_2)_2(M_1)_3$, three molar equivalents of $M_1^-$ are mixed two molar equivalents of $M_2^+$, independently or at the same time.

The metal $M_2$ is preferably a complex of a ligand (L) that may be the same or different in comparison to ligands of $M_\#^-$. The ligand may be covalently or ionically bonded to any of the metals $M_1$ and/or $M_2$. In another embodiment of the invention the ligand L is bonded covalently and/or ionically bonded and further is coordinated to the metal center of $M_1$ and/or $M_2$ as a dative bond in a Lewis acid/base sense complex.

Preferably one or all of the precursor compositions which contain the $M_2$ metals contain the nanoparticles. In another embodiment of the invention the nanoparticles are mixed with the metalide mixture and/or one of the metalides before reaction with the $LM_2$ metal complexes.

Mixing the oxidized metal/metals $M_2$ with the reduced metal mixture $M_\#^-$ in the presence of the nanoparticle forms a precipitated binary semiconductor matrix in which the nanoparticles are dispersed. In this form the binary semiconductor matrix is suspended in an aqueous medium that is alkaline and contains side products of the reduction of the metal $M_2$ by the reduced metal $M_1$. The side products are removed by allowing the precipitate to settle from solution, e.g., by centrifugation, and decanting any supernatant liquid. The thus-formed precipitate is further washed with water, an alkaline medium, and/or a polar organic solvent. Washing and isolation of the thus-formed thermoelectric material is carried out in an inert atmosphere to avoid any re-oxidation of any of the metals $M_1$ and/or $M_2$.

The precipitate formed by the reduction is generally pulverulent in form. The powder may not, however, be of uniform particle size. The precipitate is dried, e.g., at ambient temperature by exposure to a flow of inert gas, under vacuum, and/or by heating. The dried precipitate is then preferably subjected to a step of sieving in which large and/or agglomerated precipitated materials are separated from a fine powder of the precipitant material. The thus-sieved precipitate material is then press molded and sintered at elevated temperature to form the thermoelectric material.

The steps of reducing metal $M_1$, suspending metal $M_2$ in an aqueous medium, and reducing the oxidized metal $M_2$ with the reduced metal mixture $M_\#^-$ are preferably carried out in aqueous alkaline media in the substantial absence of any organic solvent and/or surfactant. These steps are likewise preferably carried out under inert atmosphere such that any reduced metals $M_1$ and/or $M_2$ are not oxidized by ambient oxygen.

EXAMPLES

To a flask was added 5.905 g of 200 mesh tellurium powder and 103 mL of water. The reaction was degassed with inert gas and cooled in an ice water bath. 6.312 g sodium borohydride was added in portions. The sodium borohydride was not added all at once to avoid a potentially dangerous buildup of heat and possible hydrogen gas ignition.

The reaction was allowed come up to room temperature slowly and react for at least 10 hours while stirring aggressively under inert gas at room temperature.

260 mL of water and 150 mL 28% $NH_4OH/H_2O$ were added to a flask. 12.807 g bismuth citrate was dissolved in the water/ammonia reaction solution. The reaction flask was degassed with inert gas and stirred.

68 mL of a 4 g/120 mL aqueous dispersion of zinc oxide nanoparticles was added to the reaction flask. Prior to, throughout, and after all of the additions, the reaction flask was stirred and kept under inert gas.

The NaTeH solution was filtered under inert gas to avoid spontaneously oxidizing the NaTeH in air. The filtered NaTeH solution was added dropwise to the stirring reaction. The reaction stirring was continued throughout the addition of the NaTeH solution and for 10 mins afterwards.

The crude $Bi_2Te_3$+ZnO composite nanoparticle reaction product was then collected by centrifugation. To minimize oxidation of the $Bi_2Te_3$+ZnO composite nanoparticles, the product was kept under an inert atmosphere as much as possible and as a methanol slurry.

The collected crude product had the consistency of black paste. It was washed with a solution of water/28% aqueous ammonium hydroxide/methanol (35/0.8/165 volumetric ratio, respectively). The product was washed under inert atmosphere reflux conditions until the reaction byproducts are removed.

The washed composite nanoparticles were then collected using a minimum amount of methanol and transferred to a flask for drying. The dried powders were handled and stored only in the glove box to avoid the possible inhalation hazard and air oxidation of the product.

As a final purification step, the dry powder was subjected to sublimation conditions.

The powder was baked at 400° C. for 2 hours. Then it was ground to a fine powder. Finally, it was hot pressed at 100 MPa and 400° C. for 4 hours. All sintering steps were conducted under an argon environment.

Figure 6:
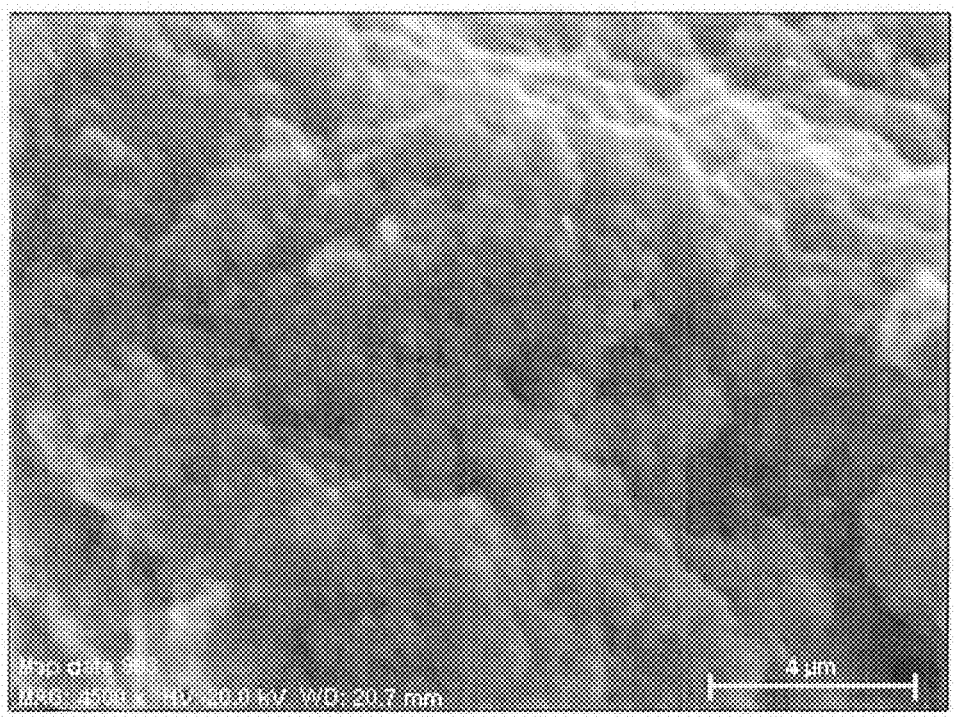
FIG. 6 shows a SEM of a thermoelectric material of the invention comprising a $Bi_2Te_3$ matrix and ZnO nanoparticles.
Figure 7:
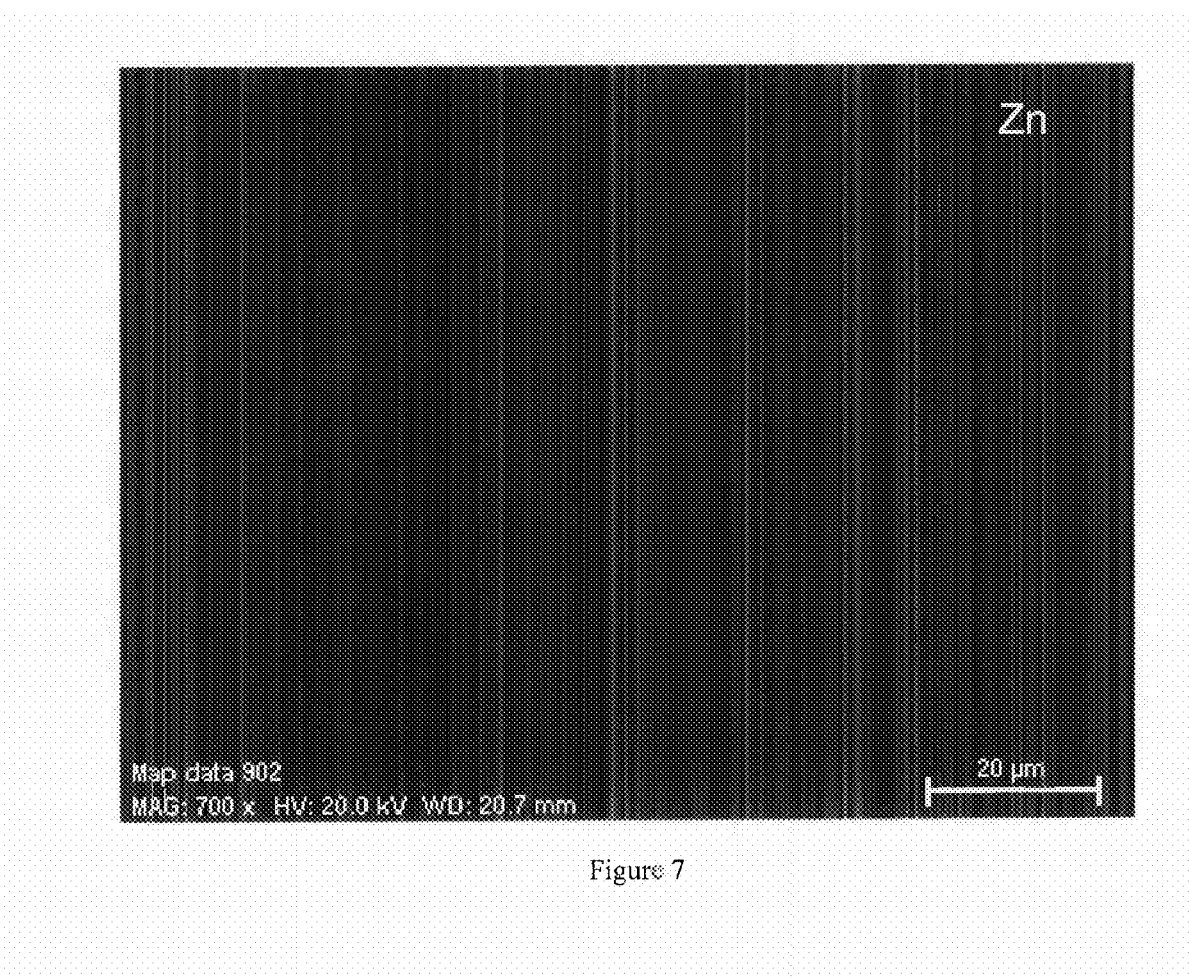
FIG. 7 shows EDS mapping of Zn in a thermoelectric material of the invention comprising a $Bi_2Te_3$ matrix and ZnO nanoparticles.
Figure 8:
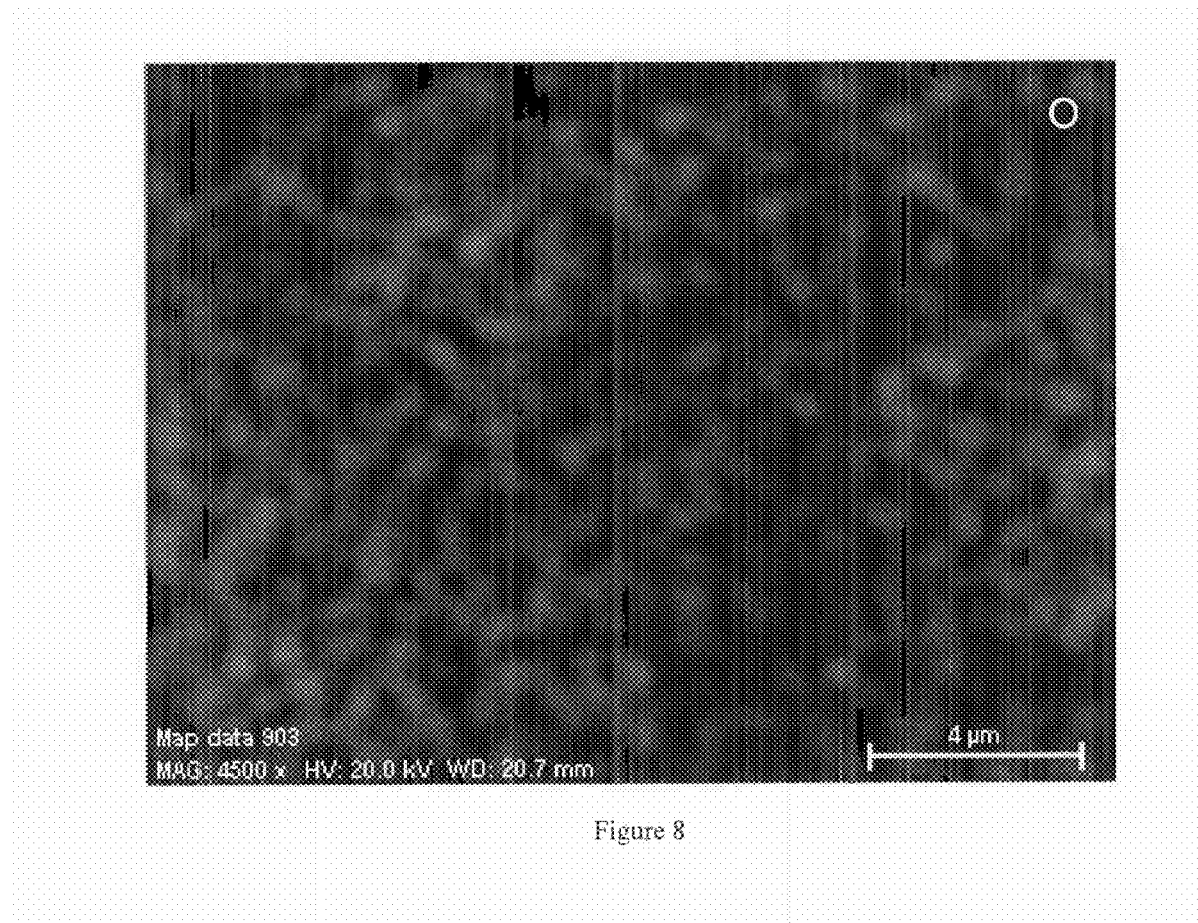
FIG. 8 shows EDS mapping of O in a thermoelectric material of the invention comprising a $Bi_2Te_3$ matrix and ZnO nanoparticles.
Figure 9:
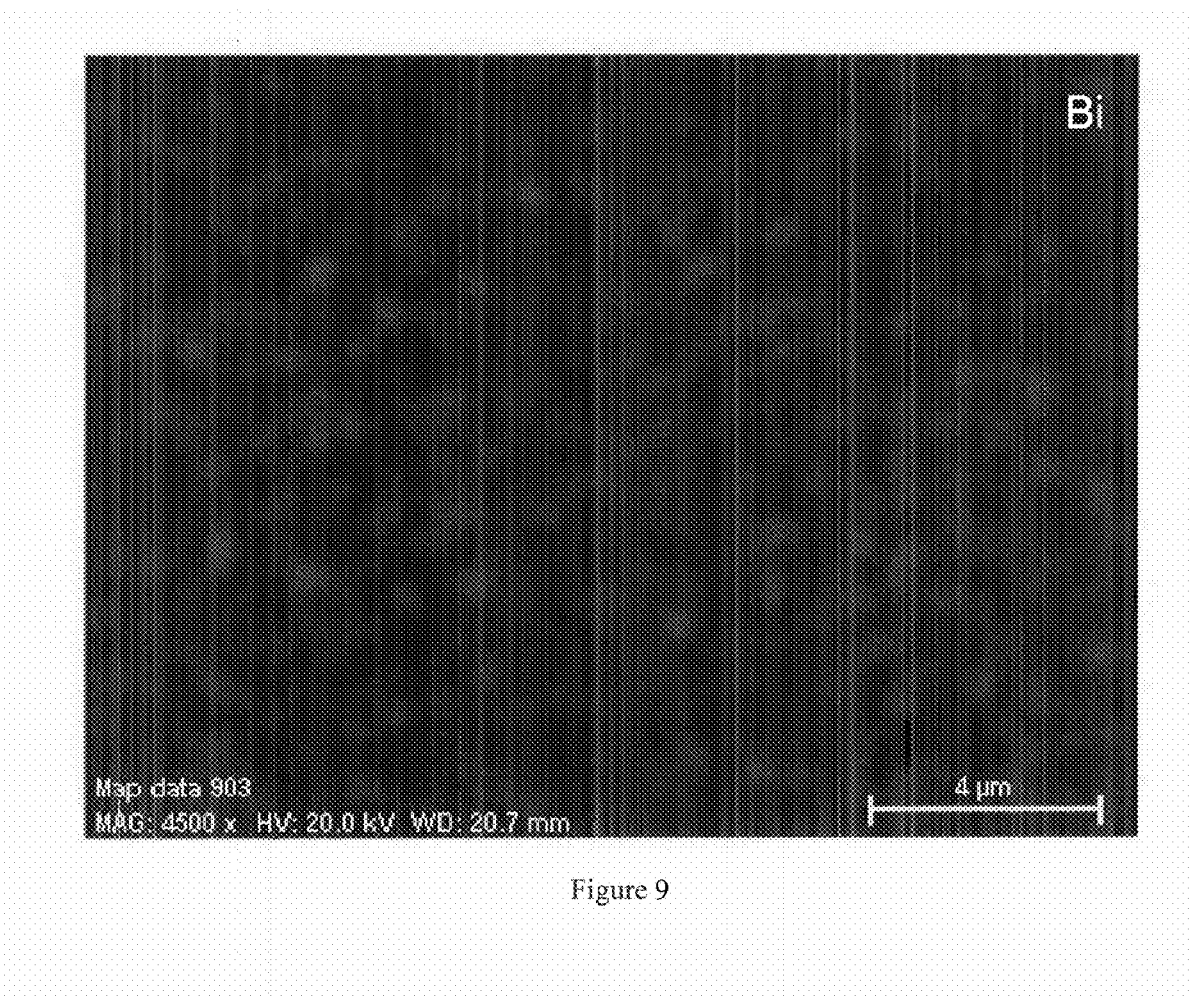
FIG. 9 shows EDS mapping of Bi in a thermoelectric material of the invention comprising a $Bi_2Te_3$ matrix and ZnO nanoparticles.
Figure 10:
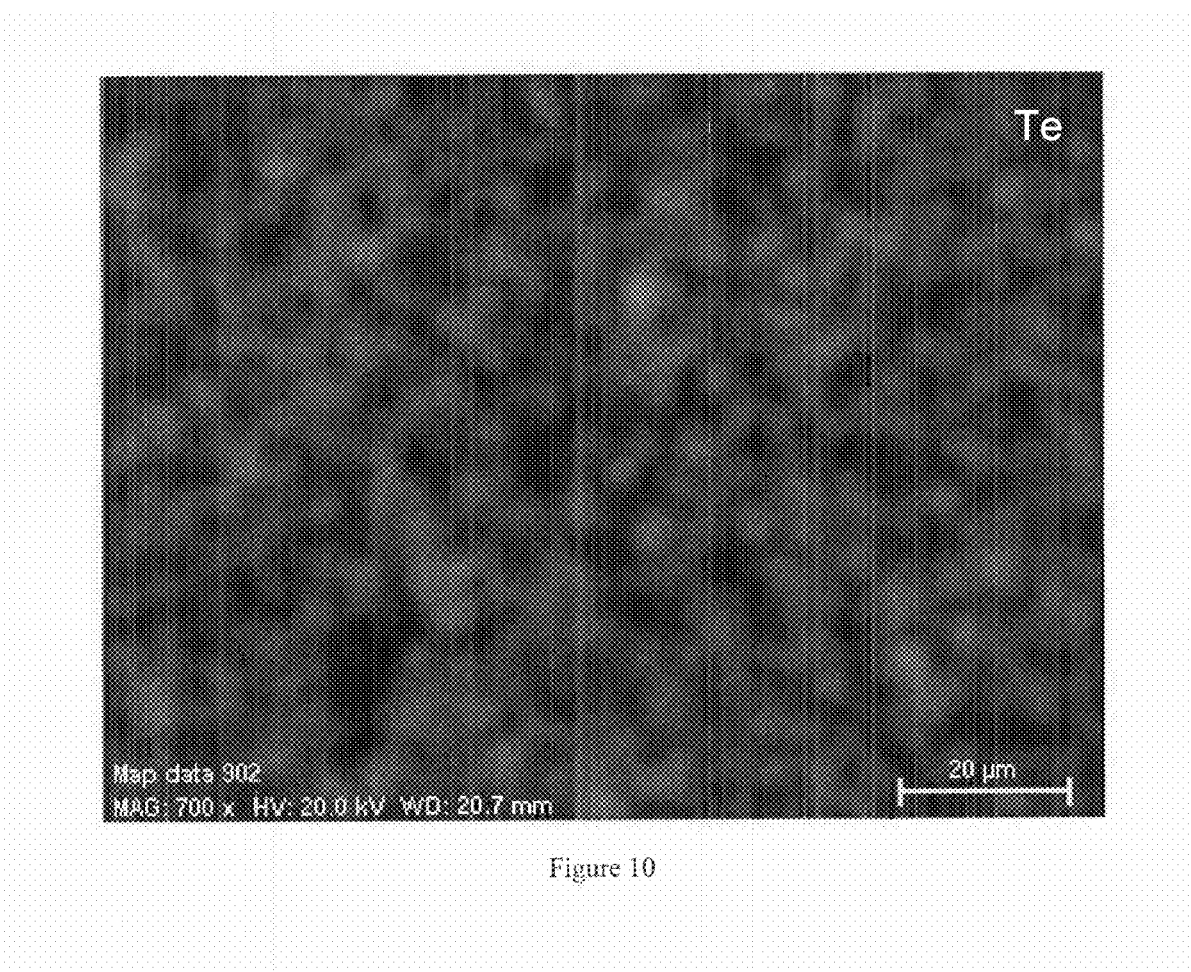
FIG. 10 shows EDS mapping of Te in a thermoelectric material of the invention comprising a $Bi_2Te_3$ matrix and ZnO nanoparticles.

FIG. 6 shows a scanning electron microscopy view of a thermoelectric material of the invention. FIGS. 7-10 provide SEM-EDS (scanning electron microscopy energy-dispersive X-ray spectroscopy) profiles of a thermoelectric material of the invention of formula $Bi_2Te_3$ containing ZnO nanoparticles. The SEM-EDS profiles show that the atoms of both the matrix material (i.e., Bi and Te) and the atoms of the nanoparticles (i.e., Zn and O) are uniformly dispersed in the thermoelectric material.

Obviously, numerous modifications and variations of the present invention are possible in light of the above teachings. It is therefore to be understood that within the scope of the appended claims, the invention may be practiced otherwise than as specifically described herein.

The invention claimed is:

1. A thermoelectric composition, comprising:
a binary main group semiconductor material of formula $Bi_2Te_3$ and ZnO nanoparticles,
wherein the ZnO nanoparticles are dispersed in a matrix of the binary main group semiconductor material,
wherein the electrical conductivity of the thermoelectric composition decreases over a temperature range of 150 to 200° C. and the Seebeck coefficient of the thermoelectric material levels off over a temperature range of 150 to 200° C.

2. The thermoelectric composition of claim 1, wherein the ZnO nanoparticles have a unimodal particle size distribution.

3. The thermoelectric composition of claim 1, wherein the ZnO nanoparticles have a sphericity of 0.95-0.99.

4. The thermoelectric composition of claim 1, wherein the ZnO nanoparticles are present in an amount of 40% by weight or less based on the binary main group semiconductor material.

5. The thermoelectric composition of claim 1, wherein the ZnO nanoparticles are present in an amount of 60% by weight or more based on the binary main group semiconductor material.

6. A thermoelectric device, comprising:
a first ceramic layer in thermal communication with a metal heat source layer and a metal layer, a first thermoelectric material and a second thermoelectric material in electrical contact with the metal layer, wherein the first thermoelectric material has a first metal pad and a first electrical contact, and the second thermoelectric material has a second metal pad and a second electrical contact, and a second ceramic layer opposite the first ceramic layer and separated by the first and second thermoelectric materials, wherein one of the first and the second thermoelectric materials is the thermoelectric composition of claim 1.

7. A process for making a thermoelectric material comprising a binary main group semiconductor material, said process comprising:

mixing at least one metal in the form of a reduced compound with at least one oxidized metal compound in the form of at least one of a halide, alkoxide, carboxylate or a mixture thereof, wherein the mixing includes mixing two different metal compounds of main group metals, wherein the mixing is carried out in water in the presence of nanoparticles of a metal oxide of formula MO wherein M is at least one element selected from the group consisting of a Group 2 element and a Group 12 element, to form the binary main group semiconductor material.

8. The process of claim 7, further comprising:

reducing only a single metal to form the reduced metal compound before the mixing by reacting the metal in the form of a metal powder with one or more reducing agents in water.

9. The process of claim 7, further comprising:

washing a precipitate formed by the mixing with at least one selected from the group consisting of an aqueous solution and an organic solution.

10. The process of claim 9, further comprising, drying the washed precipitate, then press molding the washed precipitate, and sintering the pressed washed precipitate to form a sintered binary N-type thermoelectric material comprising nanoparticles.

11. The process of claim 7, wherein the reduced metal compound is formed by reacting a mixture of tellurium metal with sodium borohydride in an aqueous alkaline media.

12. The process of claim 7, comprising:

mixing an aqueous composition comprising only one oxidized metal compound with only one reduced metal.

13. The process of claim 7, wherein the oxidized metal compound is in the form of a halide.

14. The process of claim 7, wherein the oxidized metal compound is in the form of an alkoxide.

15. The process of claim 7, wherein the oxidized metal compound is in the form of a carboxylate.

16. A process for making the thermoelectric material according to claim 1, comprising:

mixing a reduced tellurium compound and an oxidized bismuth compound in the presence of ZnO nanoparticles to form a mixture, and sintering the mixture at 400° C. and 100 MPa for 4 hours to form the thermoelectric material.

17. The process of claim 16, further comprising:

reducing only a single metal to form the reduced tellurium compound before the mixing by reacting the tellurium in the form of a metal powder with one or more reducing agents in water.

18. The process of claim 16, further comprising:

washing a precipitate formed by the mixing with at least one selected from the group consisting of an aqueous solution and an organic solution.

19. The process of claim 18, further comprising:

drying the washed precipitate, then press molding the washed precipitate, and sintering the pressed washed precipitate to form a sintered binary N-type thermoelectric material comprising ZnO nanoparticles.

20. The process of claim 16, wherein the reduced tellurium compound is formed by reacting a mixture of tellurium metal with sodium borohydride in an aqueous alkaline medium.

* * * * *